United States Patent
Mo (10) Patent No.: US 8,487,190 B2
(45) Date of Patent: Jul. 16, 2013

(54) FLEXIBLE PRINTED CIRCUIT BOARD

(75) Inventor: Yao-an Mo, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 461 days.

(21) Appl. No.: 12/755,390

(22) Filed: Apr. 6, 2010

(65) Prior Publication Data

US 2010/0252307 A1 Oct. 7, 2010

(30) Foreign Application Priority Data

Apr. 7, 2009 (TW) .............................. 98111547 A
Nov. 6, 2009 (TW) .............................. 98137853 A (51) Int. Cl.
*H05K 1/00* (2006.01)
*H05K 1/03* (2006.01)
*H05K 1/16* (2006.01)
*G02F 1/1345* (2006.01)

(52) U.S. Cl.
USPC ........... 174/254; 174/255; 174/260; 361/749; 349/150

(58) Field of Classification Search
USPC ............ 174/254, 255, 260; 361/749; 349/150
See application file for complete search history.

(56) References Cited

U.S. PATENT DOCUMENTS

| 7,327,346 | B2 | 2/2008 | Chung et al. | |
| 8,188,372 | B2* | 5/2012 | Sato et al. | 174/254 |
| 2006/0027909 | A1* | 2/2006 | Kobayashi | 257/688 |
| 2012/0211465 | A1 | 8/2012 | Tohoku | |

FOREIGN PATENT DOCUMENTS

| TW | 200847863 | 12/2008 |
| TW | I304317 | 12/2008 |
| WO | 2008035416 | 3/2008 |
| WO | WO2008035416 | * 3/2008 |

* cited by examiner

*Primary Examiner* — Eric Thomas
*Assistant Examiner* — Arun Ramaswamy (57) ABSTRACT

A flexible printed circuit board includes a substrate, signal lines, a first reinforcing layer, and a second reinforcing layer. The first surface of the substrate includes a layout zone and a reinforcing zone disposed nearby the layout zone. The signal lines are disposed on the layout zone. The first reinforcing layer is disposed on the reinforcing zone. The second reinforcing layer is disposed on the second surface of the substrate.

18 Claims, 9 Drawing Sheets

FLEXIBLE PRINTED CIRCUIT BOARD

CLAIM OF PRIORITY

This application claims priority to Taiwanese Patent Application No. 098111547 filed on Apr. 7, 2009 and Taiwanese Patent Application No. 098137853 filed on Nov. 6, 2009.

BACKGROUND OF THE INVENTION

1. Field of the Invention

The present invention relates to a flexible printed circuit board (FPC), and more particularly, to a flexible printed circuit board that is not inclined to fracture.

2. Description of Prior Art

Functionally advanced display devices have gradually been one of the important characteristics of current consumer electronics products. Among these display devices, liquid crystal display panels (LCD panels) have gradually been extensively applied to all kinds of electronic devices, such as television sets, cell phones, personal digital assistants (PDAs), digital cameras, computer screens, and notebook screens. Because of the characteristics of lightness, thinness, shortness, smallness, and flexibility, FPCs are more suitable to be a medium of LCD devices to cause different parts of circuits to be coupled to each other.

Figure 1:
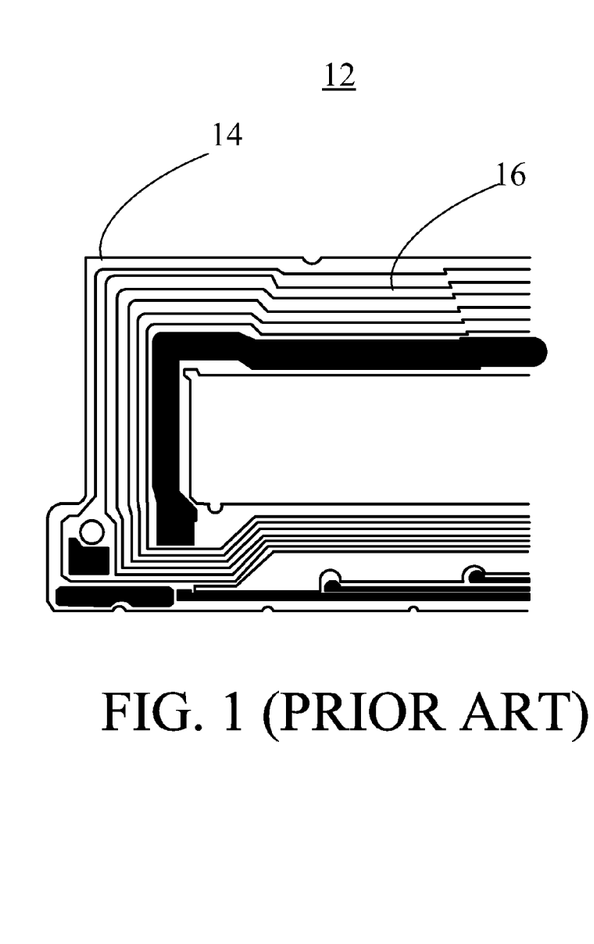
FIG. 1 illustrates a conventional FPC utilized in an LCD device.

Referring to FIG. 1 illustrating a conventional FPC 12 utilized in an LCD device, the FPC 12 comprises a substrate 14 and a plurality of signal lines 16. The plurality of signal lines 16 on the substrate 14 is utilized to transmit electrical signals. However, when a backlight module is assembled, the bent portion of the FPC 12 nearby the light source would endure larger amounts of stress and then cause to fracture, which affects luminous efficiency of backlight modules. In order to reinforce the tolerance of the FPC 12, a polyimide structure layer or a layer of tape is usually attached to the FPC 12. But, both of the methods increase not only an additional process step but also an overall thickness of the FPC 12 so that it cannot be placed into a backlight module, even resulting in incrementing the cost.

SUMMARY OF THE INVENTION

It is therefore an object of the present invention to provide a flexible printed circuit board (FPC) which is set with a first reinforcing layer and a second reinforcing layer. The first reinforcing layer and the second reinforcing layer can effectively endure stress produced during FPC bending and further, weaken stress that signal lines endure. Consequently, the mechanical strength of the FPC can be enhanced, so that the FPC is not too inclined to fracture to cause malfunctions.

Briefly summarized, a flexible printed circuit board comprises a substrate, a plurality of signal lines, a first reinforcing layer, and a second reinforcing layer. The substrate comprises a first surface and a second surface opposite to the first surface. A layout zone and a reinforcing zone disposed nearby the layout zone are on the first surface. The plurality of signal lines are disposed on the layout zone. The first reinforcing layer is disposed on the reinforcing zone. The second reinforcing layer is disposed on the second surface of the substrate.

In one aspect of the present invention, the first substrate comprises a first structure layer, the second substrate comprises a second structure layer, and both the first and the second structure layers are polyimide structure layers.

In another aspect of the present invention, the plurality of signal lines, the first reinforcing layer, and the second reinforcing layer are made of metal.

In yet another aspect of the present invention, an area of the second reinforcing layer is larger than an area of the layout area of the plurality of signal lines.

In still another aspect of the present invention, a third structure layer disposed on the second connection layer, and the third structure layer is a polyimide structure layer.

These and other objectives of the present invention will become apparent to those of ordinary skill in the art after reading the following detailed description of the preferred embodiment that is illustrated in the various figures and drawings.

DETAILED DESCRIPTION OF THE PREFERRED EMBODIMENTS

Referring to the attached figures, the following embodiments are illustrated to exemplify certain embodiments that the present invention can be applied to. The directional terms adopted in the present invention, such as upper, lower, front, back, left, right, top, and bottom, are defined merely according to the attached figures. Hence, the usage of the directional terms is to assist in elaborating, instead of confining, the present invention for better understanding.

Figure 2:
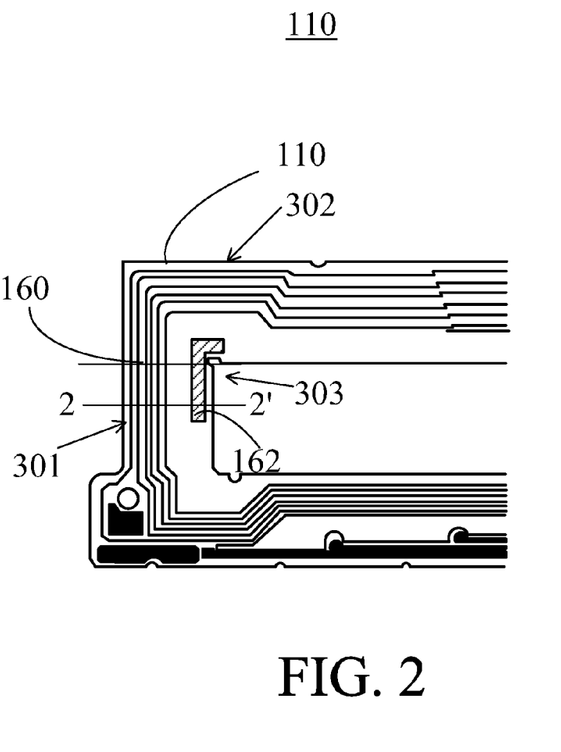
FIG. 2 illustrates the FPC of an LCD device according to a first embodiment of the present invention.
Figure 3:
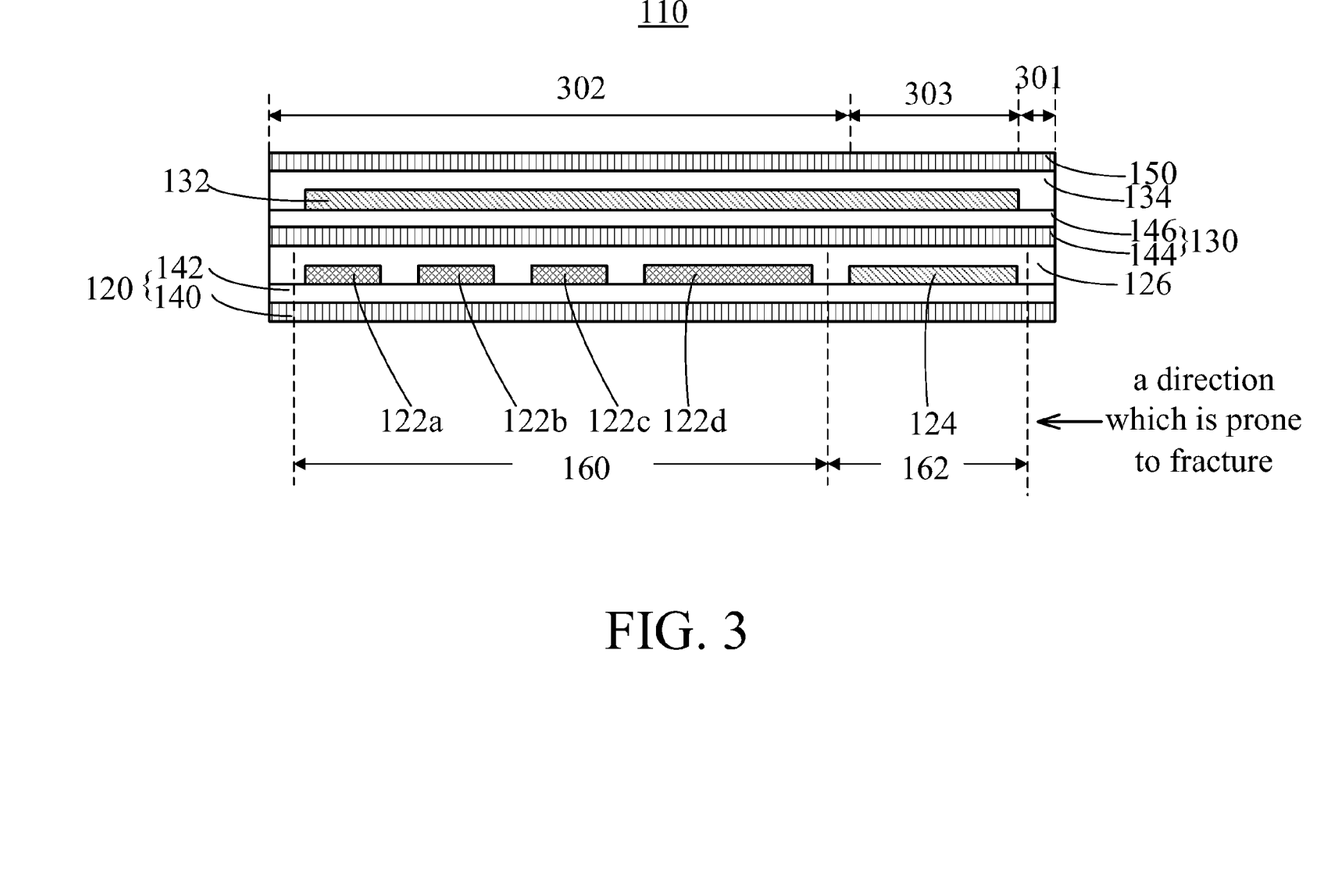
FIG. 3 demonstrates a cross-section view of lines 2-2' along the FPC shown in FIG. 2.

Referring to FIG. 2 and FIG. 3, FIG. 2 illustrates the FPC 110 of an LCD device according to a first embodiment of the present invention, and FIG. 3 demonstrates a cross-section view of lines 2-2' along the FPC 110 shown in FIG. 2. The FPC 110 for use in the LCD device comprises a first substrate 120, a first wiring layer 122, a first reinforcing layer 124, a first connection layer 126, a second substrate 130, a second reinforcing layer 132, a second connection layer 134, and a third structure layer 150. A layout zone 160 and a reinforcing zone 162 are set on the first substrate 120. The first wiring layer 122 includes a plurality of signal lines 122a-122d, setting on the layout zone 160 of the first substrate 120, are mostly made of conductive metals, such as gold, copper, or silver, to transmit electrical signals. To simplify the illustration, only four signal lines 122a-122d are drawn in FIG. 3. In practice, the numbers of the signal lines are not limited to four lines but can be adjusted according to individual demands. When the FPC 110 is bent, the bent portion 303 without any circuit thereon is most possible to fracture. So the reinforcing zone 162, which the first reinforcing layer 124 is placed on, is set alongside the signal line 122a or the signal line 122d. In this embodiment, the reinforcing zone 162 is disposed outside the layout zone 160 and near the signal line 122d, as well as on the bent portion 303, but the reinforcing zone 162 can be disposed on the area adjacent to the side-most signal line 122a. The first reinforcing layer 124 is laid on the reinforcing zone 162, and is made of metal with its thickness of 12 µm-35 µm. The first reinforcing layer 124 is an enclosed region that is not coupled to any electrical signal and is preferably parallel to the signal lines 122a-122d, so that it can be employed to enhance the mechanical strength of the FPC 110. The first connection layer 126 is set on the first substrate 120 and overlays the plurality of signal lines 122a-122d and the first reinforcing layer 124, which is utilized to insulate the plurality of signal lines 122a-122d and the first reinforcing layer 124. The second substrate 130 covers the first connection layer 126.

In order to enhance the mechanical strength of the FPC 110, the second reinforcing layer 132 is laid on the second substrate 130. Preferably, the second reinforcing layer 132 is made of metal with its thickness of 12 µm-35 µm, and the area overlaid by the second reinforcing layer 132 is greater than that laid by the signal lines 122a-122d. Because the second reinforcing layer 132 is a piece of a continuous metal film or a metal layer with multiple holes, it is able to endure larger amounts of stress so as to enhance more mechanical strength of the FPC 110. The second reinforcing layer 132 is disposed corresponding to the layout zone 160 and the reinforcing zone 162, in other words, the second reinforcing layer 132 covers larger area than the signal lines 122a-122d. The second reinforcing layer 132 is disposed over the signal lines 122a-122d and the first reinforcing layer 124. In another embodiment, the second reinforcing layer 132 can be disposed only on the reinforcing zone 162. In order to prevent the second reinforcing layer 132, which is made of metal, from contacting other conductors, the second connection layer 134 covers the second reinforcing layer 132 to insulate the latter with other conductors.

The first substrate 120 comprises a first structure layer 140 and a third connection layer 142. The second substrate 130 comprises a second structure layer 144 and a fourth connection layer 146. Both of the first structure layer 140 and the second structure layer 144 are polyimide structure layers. The first structure layer 140 is utilized to prevent the signal lines 122a-122d and the third connection layer 142 from direct exposure. The third connection layer 142 is utilized to couple the signal lines 122a-122d and the first reinforcing layer 124 to the first structure layer 140. The fourth connection layer 146 is utilized to couple the second reinforcing layer 132 to the second structure layer 144.

In addition, the FPC 110 comprises a third structure layer 150, which is set on the second connection layer 134. The third structure layer 150, which is a polyimide structure layer, is applied to preventing the second reinforcing layer 132 and the second connection layer 134 from direct exposure. Preferably, the first structure layer 140, the second structure layer 144, and the third structure layer 150 are roughly from 12.5 um to 25 um in thickness.

In the above-mentioned embodiment, the second reinforcing layer 132 and the second substrate 130 are positioned over the first substrate 120, but the second reinforcing layer 132 and the second substrate 130 also can be positioned under the first substrate 120. In another embodiment, the first substrate 120 are sandwiched between two second substrates 130 each of which sticks to the second reinforcing layers 132.

It is allowed to use the same equipment to lay the plurality of signal lines 122a-122d and the first reinforcing layer 124 on the first substrate 120 at the same time. In other words, both of the plurality of signal lines 122a-122d and the first reinforcing layer 124 have not only the same materials but the same manufacturing processes, so nearly no additional operations are required to finish manufacturing the FPC 110.

Figure 4:
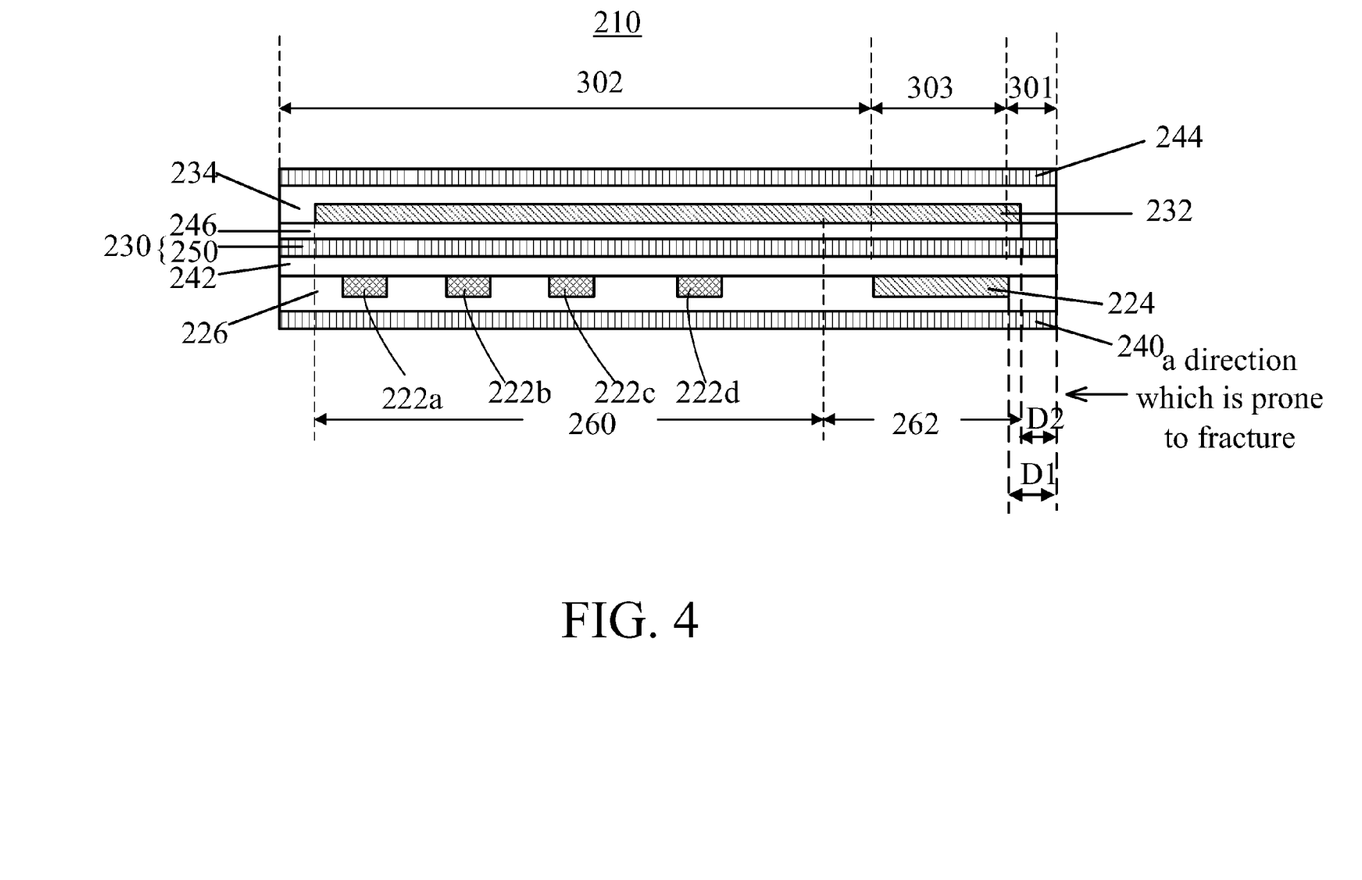
FIG. 4 illustrates a cross-section view of a FPC according to a second embodiment of the present invention.

Referring to FIGS. 2 and 4, FIG. 4 illustrates a cross-section view of a FPC 210 according to a second embodiment of the present invention. The FPC 210 for use in the LCD device comprises a substrate 230, a first wiring layer 222, a first reinforcing layer 224, a second reinforcing layer 232, a first structure layer 240, a second structure layer 244, a third structure layer 250, a first connection layer 226, a second connection layer 234, and a third connection layer 242. The substrate 230 is formed by the third structure layer 250, the third connection layer 242, and a fourth connection layer 246. The third connection layer 242 and the fourth connection layer 246 are disposed on the first surface (bottom surface) and the second surface (top surface) of the substrate 230, respectively. The first wiring layer 222, the first reinforcing layer 224, the first connection layer 226, and the first structure layer 240 are also on the first surface of the substrate 230. The second reinforcing layer 232, the second structure layer 244, and the second connection layer 234 are disposed on the second surface of the substrate 230.

The first surface of the substrate 230 is divided into a layout zone 260 and a reinforcing zone 262. A plurality of signal lines 222a-222d, setting on the layout zone 260 of the substrate 230, are mostly made of metals, such as gold, copper, or silver, to transmit electrical signals. To simplify the illustration, only four signal lines 222a-222d are drawn in FIG. 4. In practice, the numbers of the signal lines are not limited to four lines but can be adjusted according to individual demands. The reinforcing zone 262 is set outside the layout zone 260 and alongside the signal line 222d. The first reinforcing layer 224 is laid on the reinforcing zone 262, and is made of metal with its thickness of 12 µm-35 µm. The first reinforcing layer 224 is an enclosed region that is not coupled to any electrical signal so that it can be employed to enhance the mechanical strength of the FPC 210. Besides, the first reinforcing layer 224 is preferably parallel to the signal lines 222a-222d. The first connection layer 226 is set on the substrate 230 and overlays the plurality of signal lines 222a-222d and the first reinforcing layer 124, which is utilized to insulate the plurality of signal lines 222a-222d and the first reinforcing layer 224. The third connection layer 242 is utilized to couple the signal lines 222a-222d and the first reinforcing layer 224 to the third structure layer 250. The first structure layer 240 covers the first connection layer 226.

In order to enhance the mechanical strength of the FPC 210, the second reinforcing layer 232 is laid on the second surface (top surface) of the substrate 230. Preferably, the second reinforcing layer 232 is made of metal with its thickness of 12 µm-35 µm, and the area overlaid by the second reinforcing layer 232 is greater than that laid by the signal lines 222a-222d. Because the second reinforcing layer 232 is a piece of a continuous metal film or a continuous metal layer with multiple holes, it is able to endure larger amounts of stress so as to enhance more mechanical strength of the FPC 210. The second reinforcing layer 232 corresponds to the layout zone 260 and the reinforcing zone 262, in other words, the second reinforcing layer 232 covers larger area than the signal lines 222a-222d. The second reinforcing layer 232 is disposed over the signal lines 222a-222d and the first reinforcing layer 224 to enhance not only more mechanical strength of the FPC 210 but also that of the layout area 260. In order to prevent the second reinforcing layer 232 from contacting other conductors, the second connection layer 234 covers the second reinforcing layer 232 to insulate the latter with other conductors.

The first reinforcing layer 224 comprises a first edge near the edge of substrate 230, and the second reinforcing layer 232 comprises a second edge near the edge of substrate 230. A distance D1 from the edge of substrate 230 to the first edge can be longer than a distance D2 from the edge of substrate 230 to the second edge. In other words, in contrast to the first edge of the first reinforcing layer 224, the second edge of the second reinforcing layer 232 is closer to the substrate 230. Therefore, when the FPC 210 is applied by a shear stress, the second reinforcing layer 232 serves as a first wall to resist the shear stress, and the first reinforcing layer 224 serves as a second wall to resist the shear stress. In another embodiment, the first edge is substantially flush with the second edge, i.e. D2 equals to D1, so that the first reinforcing layer 224 and the second reinforcing layer 232 serves jointly as wall to resist shear stress applied on the FPC 210. In addition, the second structure layer 244 covers the second connection layer 234 to prevent the second connection layer 234 from scratching.

Figures 5A, 5B, 5C:
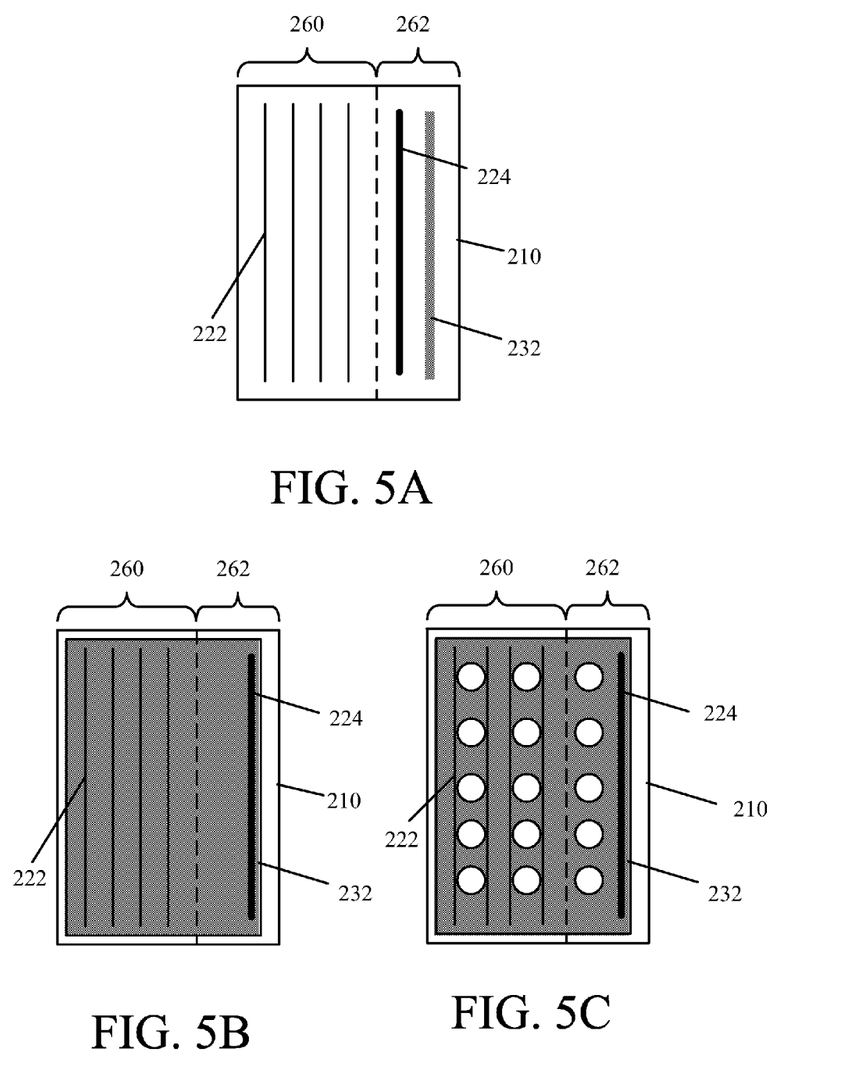
FIGS. 5A-5E illustrate patterns of the second reinforcing layer and its position relative to the first reinforcing layer.
Figure 5D:
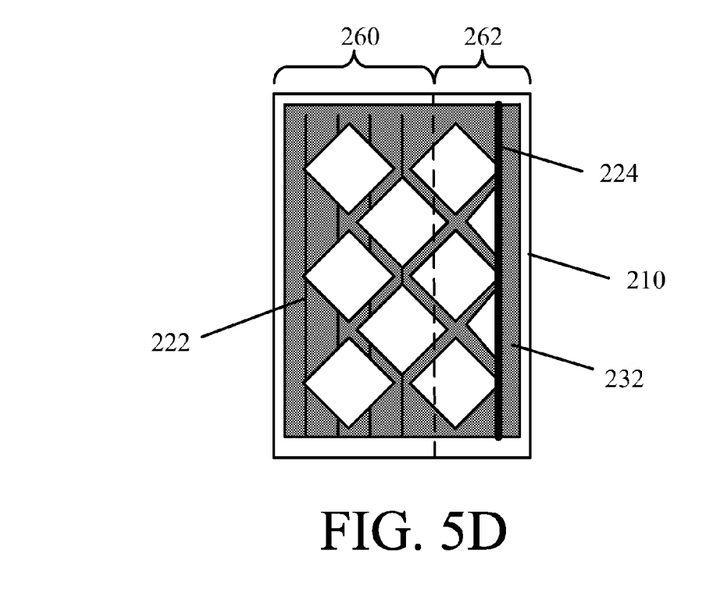
Figure 5E:
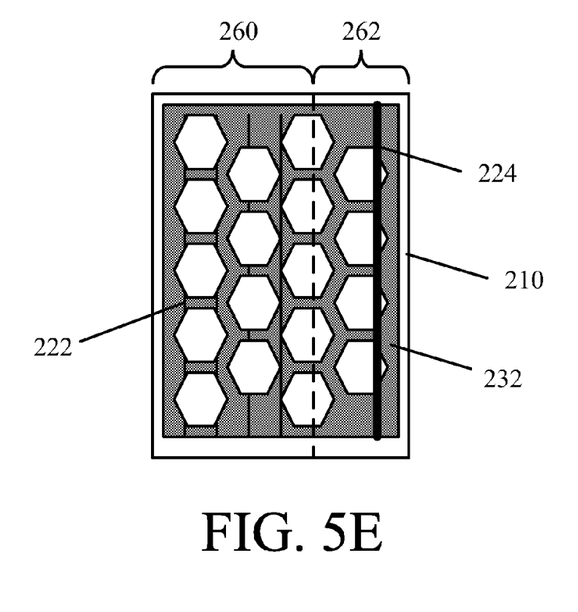

Referring to FIGS. 5A-5E, FIGS. 5A-5E illustrate the top view of the patterns of the second reinforcing layer 232 and its position relative to the first reinforcing layer 224. It is noted that for convenience of description, the first reinforcing layer 224 and the second reinforcing layer 232 overlap in FIGS. 5A-5E, but the first reinforcing layer 224 is not disposed on the same layer with the second reinforcing layer 232. Preferably, the first reinforcing layer 224 is a piece of a metal film and the second reinforcing layer 132 is a piece of a continuous metal film or a continuous metal layer with multiple holes. The first reinforcing layer 224 and the second reinforcing layer 232 are made of metal with its thickness of 12 μm-35 μm. As shown in FIG. 5A, the first reinforcing layer 224 and the second reinforcing layer 232 both shaped as bars. The first reinforcing layer 224 and the second reinforcing layer 232 correspond to the reinforcing zone 262. The second edge of the second reinforcing layer 232 is closer to the edge of the substrate 230 than the first edge of the first reinforcing layer 224 is. Or, as shown in FIG. 5B, the second reinforcing layer 232 is a piece of a metal film and corresponds to the reinforcing zone 262 and the layout zone 260. The second edge of the second reinforcing layer 232 is closer to the edge of the substrate 230 than the first edge of the first reinforcing layer 224 is. Or, as shown in FIGS. 5C-5E, the second reinforcing layer 232 is a continuous metal film with holes which are shaped as various patterns such as bars, circles, squares, ellipses, hexagons, irregular polygons and so on. In order to reinforce the mechanical strength of the FPC, any first reinforcing layer 124 and second reinforcing layer 132 which are made of metal to form an continuous construction belong to the scope of the present invention. Preferably, the layout area of the signal lines and the first reinforcing layer 224 on the first surface of the substrate 230 substantially equals to that of the second reinforcing layer 232 on the second surface of the substrate 230. In other words, a metal coverage ratio (i.e. a ratio of the metal area and the substrate area) of the first surface of the substrate 230 substantially equals to that of the second surface. If the metal coverage ratios of the two surfaces are not uniform, the FPC 210 intends to bend due to a heat effect. As a result, it suggests that the metal coverage ratios of the two surfaces of the substrate 230 are nearly identical to avoid bent phenomenon of the FPC 210.

In this embodiment, the structure layers 240, 244, and 260 are polyimide layer and are roughly from 12.5 um to 25 um in thickness.

It is allowed to use the same equipment to lay the plurality of signal lines 222a-222d and the first reinforcing layer 224 on the substrate 230 at the same time. In other words, both of the plurality of signal lines 222a-222d and the first reinforcing layer 224 have not only the same materials but the same manufacturing processes, so nearly no additional operations are required to finish manufacturing the FPC 210.

Figure 6:
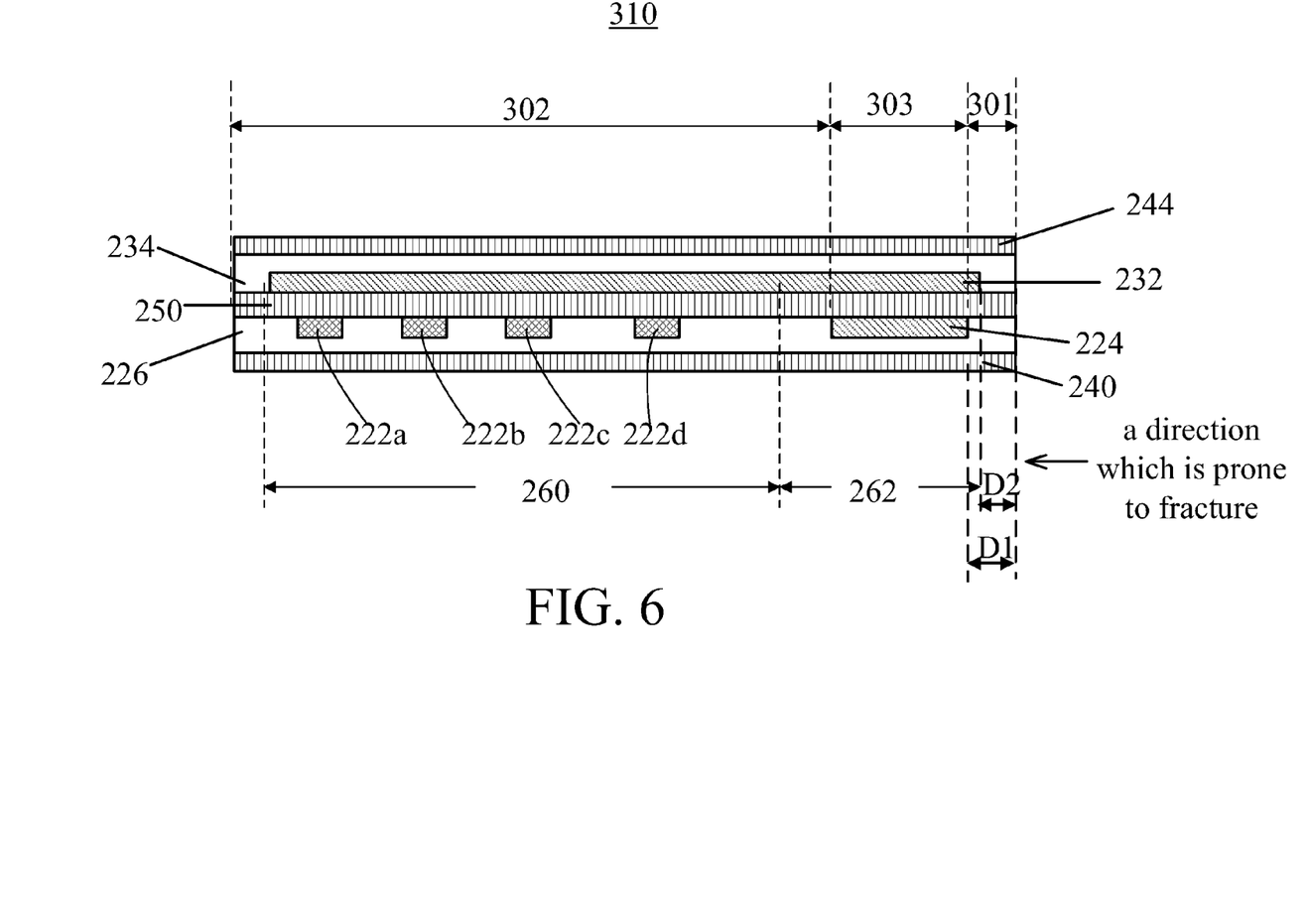
FIG. 6 shows a cross-section view of the FPC according to a third embodiment of the present invention.

Referring to FIG. 6 showing a cross-section view of the FPC 310 according to a third embodiment of the present invention, for simplicity, elements in FIG. 6 that have the same function as that illustrated in FIG. 4 are provided with the same item numbers as those used in FIG. 4. Differing from FPC 210 in FIG. 4, the substrate is the third structure layer 250. In addition, the signal lines 222a-222d and the first reinforcing layer 224 are directly formed on the third structure layer 250 by sputtering without needing the third connection layer 242.

Figure 7:
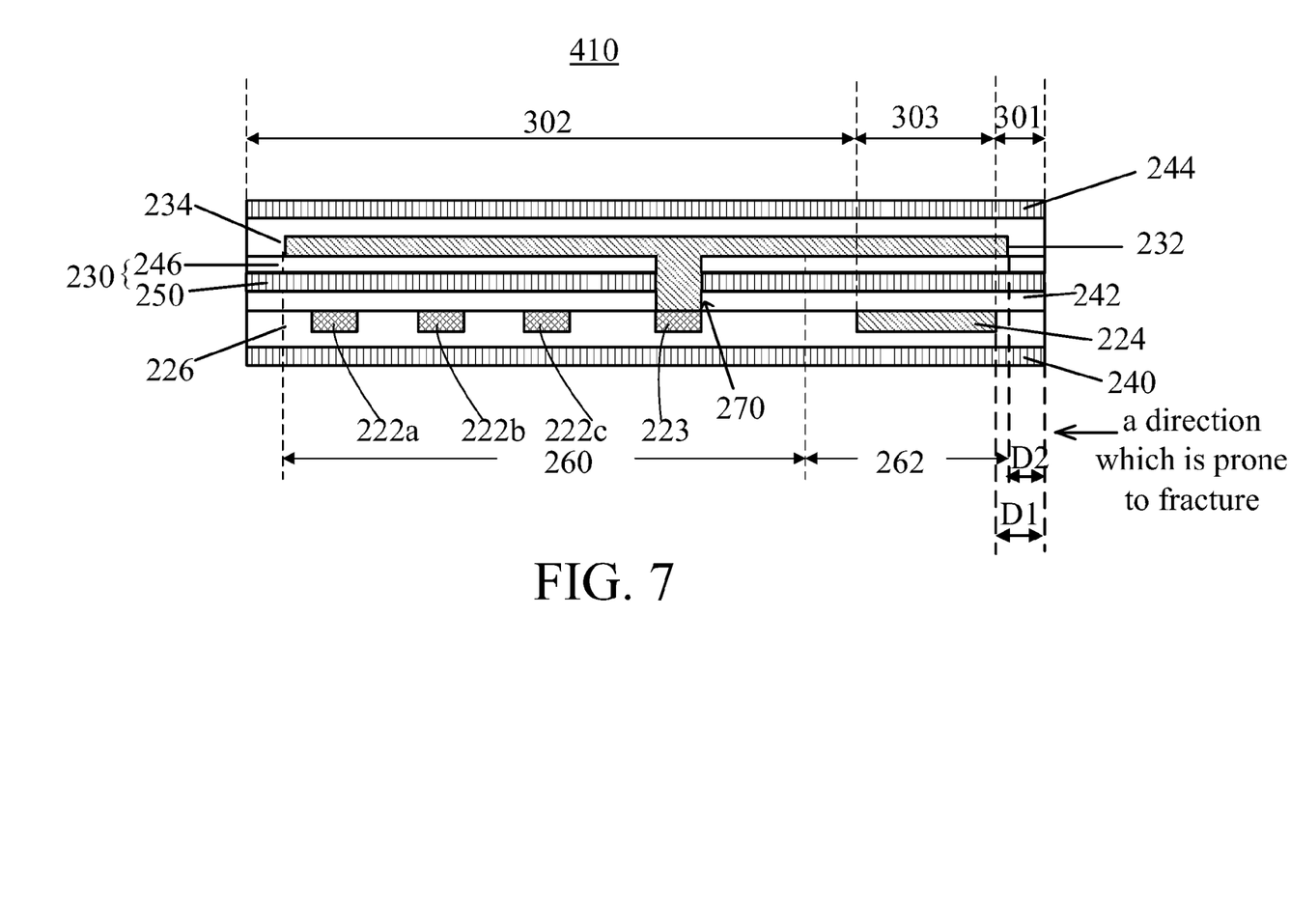
FIG. 7 showing a cross-section view of the FPC according to a fourth embodiment of the present invention

Referring to FIG. 7 showing a cross-section view of the FPC 410 according to a fourth embodiment of the present invention, for simplicity, elements in FIG. 7 that have the same function as that illustrated in FIG. 4 are provided with the same item numbers as those used in FIG. 4. Differing from FPC 210 in FIG. 4, a ground wire 223 is substitute for the signal line 222d of the FPC 410, and the second reinforcing layer 232 electrically connects to the ground wire 223 through a first via 270. As a result, not only the second reinforcing layer 232 and the ground wire 223 are coupled to ground, but also heat generated from the signal lines 222a-222c can be transferred to an ambient environment or to a heat-dissipation system through the second reinforcing layer 232.

Figure 8:
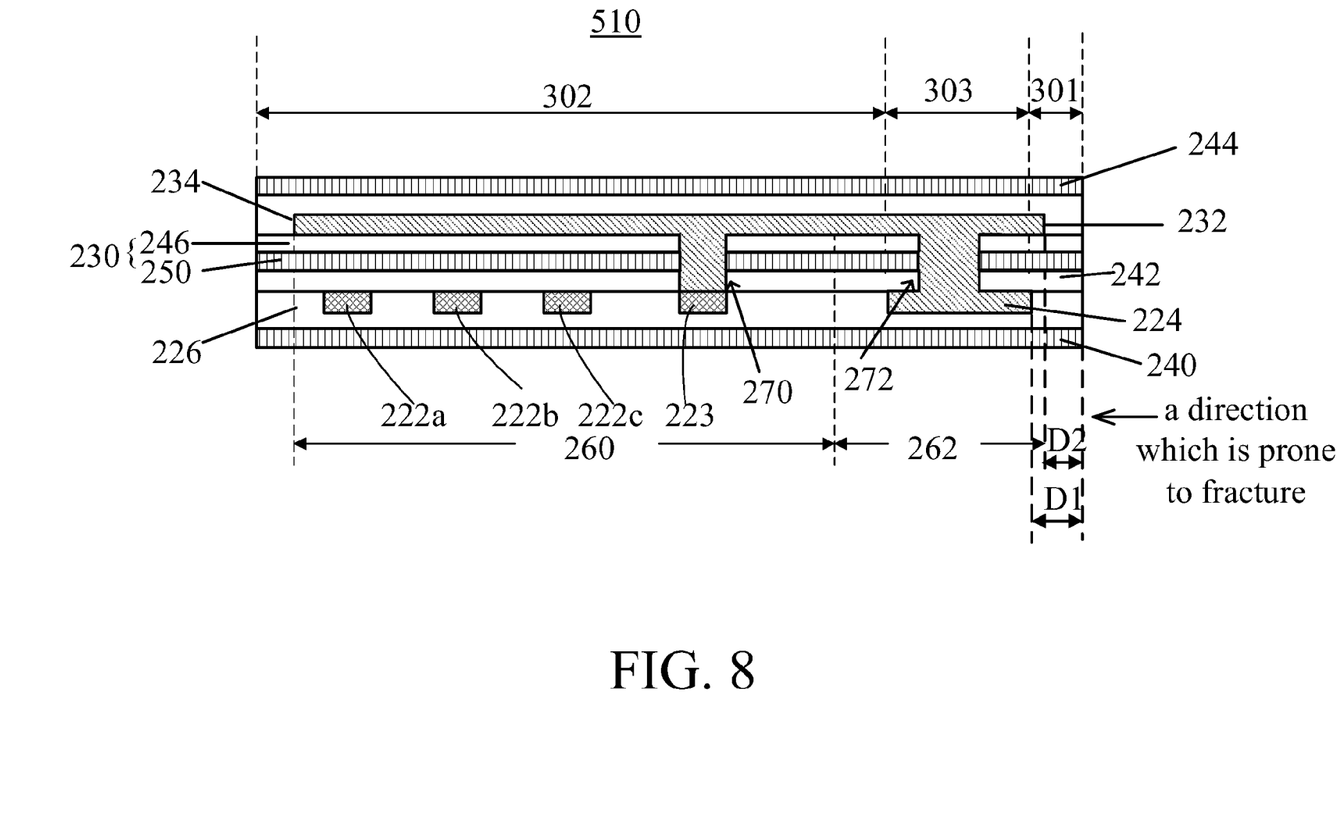
FIG. 8 shows a cross-section view of the FPC according to a fifth embodiment of the present invention

Referring to FIG. 8 showing a cross-section view of the FPC 510 according to a fifth embodiment of the present invention, for simplicity, elements in FIG. 8 that have the same function as that illustrated in FIG. 4 are provided with the same item numbers as those used in FIG. 4. Differing from FPC 210 in FIG. 4, a ground wire 223 is substitute for the signal line 222d of the FPC 510 is coupled to ground, and the second reinforcing layer 232 electrically connects to the ground wire 223 through a first via 270, and a second reinforcing layer 232 electrically connects to a first reinforcing layer 224 via a second via 272. As a result, not only the first reinforcing layer 224, the second reinforcing layer 232, and the ground wire 223 are coupled to ground, but also heat generated from the signal lines 222a-222c can be transferred to an ambient environment or to a heat-dissipation system through the second reinforcing layer 232 and the first reinforcing layer 224.

Comparing with Prior Art, the characteristic of the FPC in the present invention is that a first reinforcing layer and a second reinforcing layer are set outside of signal lines that transmit electrical signals. So, when the FPC endures repeated bending several times, the first reinforcing layer and the second reinforcing layer are able to effectively endure stress produced during bending and further, to weaken stress that the signal lines endured. Hence, the first reinforcing layer and the second reinforcing layer in the present invention can reinforce the mechanical strength of the FPC to protect the FPC from fracturing and then lapsing easily. In addition, the materials used in the first reinforcing layer are the same as those used in the signal lines, so both of the first reinforcing layer and the signal lines can be produced in the same manufacturing processes without increasing cost too much. Attributing to the design that the first reinforcing layer and the second reinforcing layer reinforce the FPC, the degree of bending of the FPC can be effectively enhanced, and the service life of the FPC can be extended as well.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A flexible printed circuit board, comprising:
   A substrate comprising a first surface and a second surface opposite to the first surface, wherein a layout zone and a reinforcing zone disposed nearby the layout zone are on the first surface;
   A plurality of signal lines disposed on the layout zone;
   A first reinforcing layer disposed on the reinforcing zone and not coupling to any signal line; and
   a second reinforcing layer disposed on the second surface of the substrate and not coupling to any signal line, and
   the first reinforcing layer and the second reinforcing layer are closer to the edge of the substrate than the plurality of signal lines are,
   wherein in a top view of the flexible printed circuit board, the substrate comprises a first portion, a second portion, and a bent portion therebetween, and part of the first reinforcing layer and part of the second reinforcing layer are disposed on periphery area of the bent portion.

2. The flexible printed circuit board of claim 1 further comprising a first connection layer covering the plurality of signal lines, the first reinforcing layer, and the substrate.

3. The flexible printed circuit board of claim 2 further comprising a second connection layer disposed on the second surface of the substrate for covering the second reinforcing layer.

4. The flexible printed circuit board of claim 3 further comprising a first structure layer disposed on the first connection layer and a second structure layer disposed on the second connection layer, the first structure layer and the second structure layer are polyimide structure layer.

5. The flexible printed circuit board of claim 1 wherein the substrate comprises a third structure layer being a polyimide structure layer.

6. The flexible printed circuit board of claim 3 wherein the substrate further comprises a third connection layer on the first surface and a fourth connection layer on the second surface, the first connection layer, the plurality of signal lines and the first reinforcing layer are disposed on the third connection layer, and the second reinforcing layer and the second connection layer are disposed on the fourth connection layer.

7. The flexible printed circuit board of claim 1 wherein the plurality of signal lines, the first reinforcing layer, and the second reinforcing layer are made of the same material.

8. The flexible printed circuit board of claim 1 wherein the first reinforcing layer is parallel to the plurality of signal lines.

9. The flexible printed circuit board of claim 1 wherein the first reinforcing layer and the second reinforcing layer are made of metal.

10. The flexible printed circuit board of claim 1 wherein an area of the second reinforcing layer is larger than a layout area of the plurality of signal lines.

11. The flexible printed circuit board of claim 1 wherein the first reinforcing layer comprises a first edge adjacent to the edge of the substrate, the second reinforcing layer comprises a second edge adjacent to the edge of the substrate, and the first edge is flush with the second edge.

12. The flexible printed circuit board of claim 1 wherein the first reinforcing layer comprises a first edge adjacent to the edge of the substrate, the second reinforcing layer comprises a second edge adjacent to the edge of the substrate, and the second edge is closer to the edge of the substrate than the first edge is.

13. The flexible printed circuit board of claim 1 wherein the second reinforcing layer is disposed correspondingly to the layout area and the reinforcing area.

14. The flexible printed circuit board of claim 1 wherein the second reinforcing layer is disposed correspondingly to the reinforcing area.

15. The flexible printed circuit board of claim 1 wherein the second reinforcing layer is a continuous metal film with a plurality of holes.

16. The flexible printed circuit board of claim 15 wherein a metal coverage ratio of the first surface substantially equals to that of the second surface.

17. The flexible printed circuit board of claim 1 further comprising a ground wire disposed on the layout zone, the second reinforcing layer electrically connects to the ground wire through a first via.

18. The flexible printed circuit board of claim 17 wherein the first reinforcing layer electrically connects to the second reinforcing layer through a second via.

* * * * *